United States Patent [19]
Ryat

[11] Patent Number: 5,208,552
[45] Date of Patent: May 4, 1993

[54] RAIL TO RAIL OPERATIONAL TRANSCONDUCTANCE AMPLIFIER

[75] Inventor: Marc Ryat, Grenoble, France

[73] Assignee: SGS-Thomson Microelectronics S.A., Gentilly, France

[21] Appl. No.: 834,059

[22] Filed: Feb. 11, 1992

[30] Foreign Application Priority Data

Feb. 12, 1991 [FR] France ................. 91 01974

[51] Int. Cl.[5] .............................. H03F 3/45
[52] U.S. Cl. ............................ 330/253; 330/255; 330/257
[58] Field of Search ............. 330/252, 253, 255, 257, 330/295

[56] References Cited

U.S. PATENT DOCUMENTS

| | | | |
|---|---|---|---|
| 3,497,824 | 2/1970 | Goordman | 330/258 |
| 4,555,673 | 11/1985 | Huijsing et al. | 330/258 |
| 4,574,250 | 3/1986 | Senderowicz | 330/258 |
| 4,851,786 | 7/1989 | Vinn et al. | 330/252 |
| 4,887,048 | 12/1989 | Krenik | 330/258 |

*Primary Examiner*—James B. Mullins
*Attorney, Agent, or Firm*—Lowe, Price, LeBlanc & Becker

[57] ABSTRACT

A transconductance amplifier comprises two complementary differential amplifiers at the input (T1a,T2a; T1b,T2b), the quiescent currents of which are fixed by two current sources (Ia, Ib), respectively. The transconductance amplifier has a first operating range where the two differential amplifiers are active and second and third operating ranges where only one differential amplifier is active. Means (T3a,T4a,Iaa; T3b,T4b,Ibb) are provided for deriving a predetermined fraction of the currents provided by the current sources to the differential amplifiers, the means being respectively in one of the second or third ranges and the predetermined fraction being such that the transconductance of the active transistors in one of the second or third ranges is equal to twice the transconductance of the transistors in the first range.

21 Claims, 3 Drawing Sheets

RAIL TO RAIL OPERATIONAL TRANSCONDUCTANCE AMPLIFIER

BACKGROUND OF THE INVENTION

The present invention relates to operational transconductance amplifiers (OTAs) and more particularly to OTAs with a high common mode excursion, so-called rail to rail OTAs.

FIG. 1 is a simplified drawing of a conventional rail to rail OTA. This OTA comprises an input stage with two complementary MOS differential amplifiers.

The first differential amplifier comprises two N-channel MOS transistors T1a and T2a, the gates of which are respectively connected to a non-inverting input (+) and to an inverting input (−). The sources of the transistors are interconnected and are loaded by a current source Ia connected to a negative supply rail Vss and drawing a current $2I_0$.

The second differential amplifier comprises two P-channel MOS transistors T1b and T2b, the gates of which are respectively connected to inputs (+) and (−). The sources of these transistors are interconnected and are loaded by a current source Ib connected to a positive supply rail Vdd and providing a current $2I_0$.

The drains of transistors T1a and T2a are respectively connected to the input of a current mirror M1a and to the input of a current mirror M2a. A current mirror is a two-channel circuit which copies on its second channel, here called output, the current present on a first channel, here called input and designated by an arrow. The outputs of the current mirrors M1a and M2a are respectively connected to the drain of transistor T2b and to the drain of transistor T1b. The drain of transistor T2b is connected to the input of a current mirror M2b, the output of which is connected to the input of a current mirror M3. The drain of transistor T1b is connected to the input of a current mirror M1b. The outputs of the current mirrors M3 and M1b are interconnected and constitute the output S of the amplifier.

The normal operation of the circuit is as follows.

In the absence of a differential signal between the inputs (+) and (−), the current in the drains of each transistor T1a, T2a, T1b, T2b, is equal to a quiescent current $I_0$ equal to half the current $2I_0$ fixed by the current sources Ia and Ib.

When a voltage V1 is applied to the input (.) and a voltage V2 to the input (−), a current I1 flows in the drains of each transistor T1a and T2b and a current I2 flows in the drains of each transistor T2a and T1b; currents I1 and I2 verify the following relations:

$$I1+I2=2I_0, \text{ and}$$

$$I1-I2=(V1-V2)g_m(I_0)$$

where $g_m(I_0)$ designates the transconductance of each transistor for a quiescent drain current equal to $I_0$.

The drain current I1 of transistor T1a is copied to the output of current mirror M1a and is added to the drain current I1 of transistor T2b, the input of current mirror M2b thus receives a current 2I1. Similarly, the drain current I2 of transistor T2a is copied to the output of mirror M2a and is added to the drain current I2 of transistor T1b, mirror M1b thus receives at its input a current 2I2. Thus, mirror M3, the input of which receives the output current 2I1 from mirror M2b, provides at the output S a current 2I1 and mirror M1b draws from output S a current 2I2. Therefore, the output S of the OTA provides a current Is such that:

$$Is=2(I1-I2)=2(V1-V2)g_m(I_0).$$

The transconductance of the OTA is therefore equal to $2g_m(I_0)$.

When one of the currents I1 or I2 is null, the other current is equal to the current provided by sources Ia and Ib. Then, the output current Is is maximum and is here $4I_0$. This current determines the maximum charge speed of spurious capacitances present in the OTA, and of a capacitance that may be present at the output. This charge speed is usually known as "slew-rate".

In addition to the normal operating range described above, this amplifier comprises two exceptional operating ranges:

if voltages V1 and V2 go too close to the supply voltage Vdd, transistors T1b and T2b are no longer biased and become inactive, their drain currents cancel, and the current mirrors M1b and M2b respectively only receive at their inputs current I2 from mirror M2a and current I1 from mirror M1a; the OTA then provides at its output a current Is such that:

$$Is=I1-I2=(V1-V2)g_m(I_0);$$

if voltages V1 and V2 go too close to the supply voltage Vss, transistors T1a and T2a become inactive and their drain currents cancel. The mirrors M1b and M2b respectively only receive at their inputs current I2 from transistor T1b and current I1 from transistor T2b; the output current of the OTA is in this case also equal to I1−I2.

Over both these operating ranges, the transconductance of the OTA is equal to $g_m(I_0)$ and the maximum output current is $2I_0$.

Therefore, a drawback of such an OTA is that its transconductance is halved as the OTA passes from the normal operating range to one of the exceptional operating ranges. Thus, if a constant transconductance is desired, the common mode of the amplifier is limited to the normal operating range.

SUMMARY OF THE INVENTION

An object of the invention is to provide an OTA that has an equal transconductance over the three operating ranges.

This object is achieved with a transconductance amplifier comprising: a first differential amplifier with a pair of transistors of a first type, each of which is controlled by one of the two inputs, the quiescent current of these transistors being fixed to a predetermined value by a first current source connected to a first supply rail; a second differential amplifier with a pair of transistors of a type opposite to that of the first, each of which is controlled by one of the inputs, the quiescent current of these transistors being fixed to the predetermined value by a second current source connected to a second supply rail. The transconductance amplifier has a first operating range where the two differential amplifiers are active and second and third operating ranges where only one of the differential amplifiers is active. This transconductance amplifier comprises means for deriving constant current equal to a predetermined fraction of the currents provided by the current sources to the differential amplifiers, these means being active in the first operating range and inactive respectively in one of the second or third ranges and the predetermined fraction being such that the transconductance of the active transistors in one of the second or third ranges is twice the transconductance of the transistors in the first range.

According to an embodiment of the invention, the means comprise: a third pair of transistors of the opposite type, each of which is controlled by one of the inputs, the transistors being arranged in parallel between the first current source and a third current source connected to the second supply rail; and a fourth pair of transistors of the first type, each of which is controlled by one of the inputs, these transistors being arranged in parallel between the second current source and a fourth current source connected to the first supply rail; the current provided by each of the third and fourth current sources being equal to the predetermined fraction.

According to an embodiment of the invention, the predetermined fraction is equal to 75% of the current provided by the first or second current source when the transistors are of the field effect type.

According to an embodiment of the invention, the predetermined fraction is equal to 50% of the current provided by the first or second current source when the transistors are of the bipolar type.

According to an embodiment of the invention, the transconductance amplifier comprises: a first current mirror, the input of which loads one of the transistors of the first differential amplifier; a second current mirror, the input of which loads the other transistor of the first differential amplifier; a third current mirror, the input of which loads one of the transistors of the second differential amplifier; and a fourth current mirror, the input of which loads the other transistor of the second differential amplifier. The output of the first mirror is connected to the input of the fourth, the output of the third to the input of the second, and the outputs of the second and fourth mirrors are interconnected and constitute the output of the amplifier.

BRIEF DESCRIPTION OF THE DRAWINGS

The foregoing and other object, features and advantages of the invention will be apparent from the following detailed description of preferred embodiments as illustrated in the accompanying figures wherein.

DETAILED DESCRIPTION OF THE INVENTION

Figure 1:
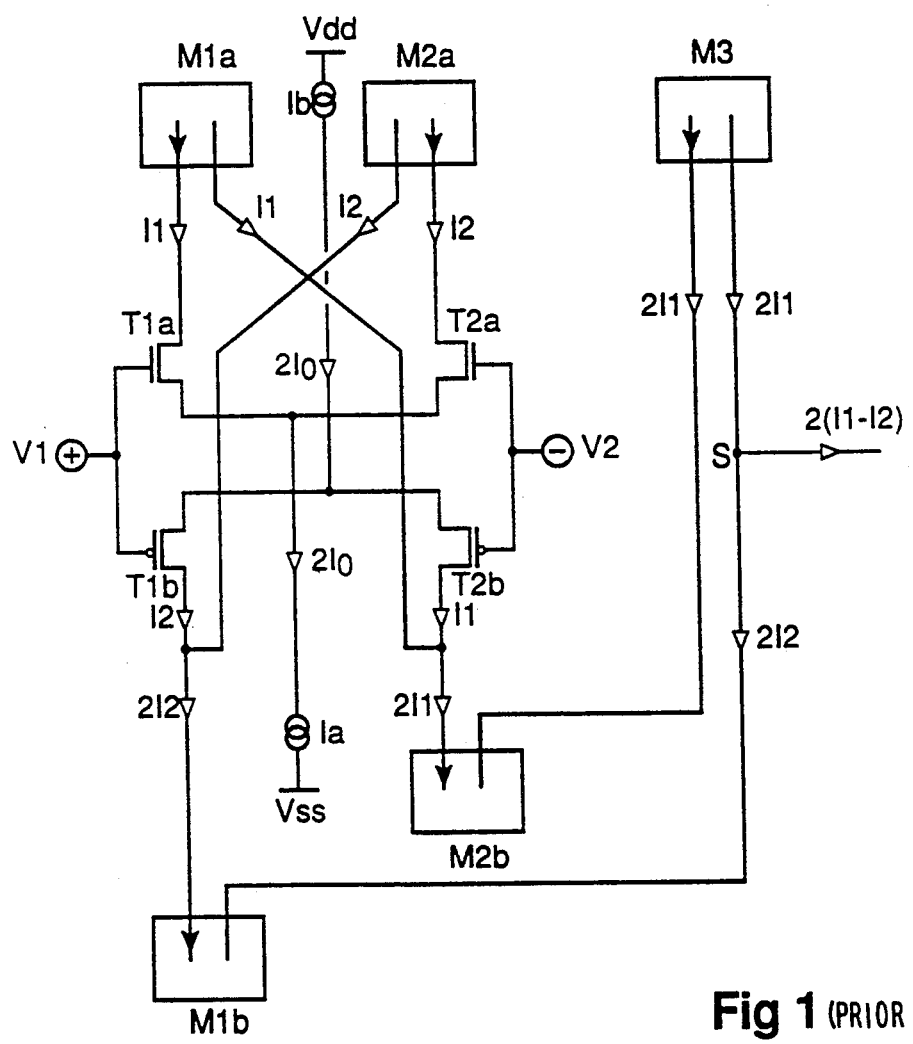
FIG. 1, described above, illustrates the state of the art.
Figure 2:
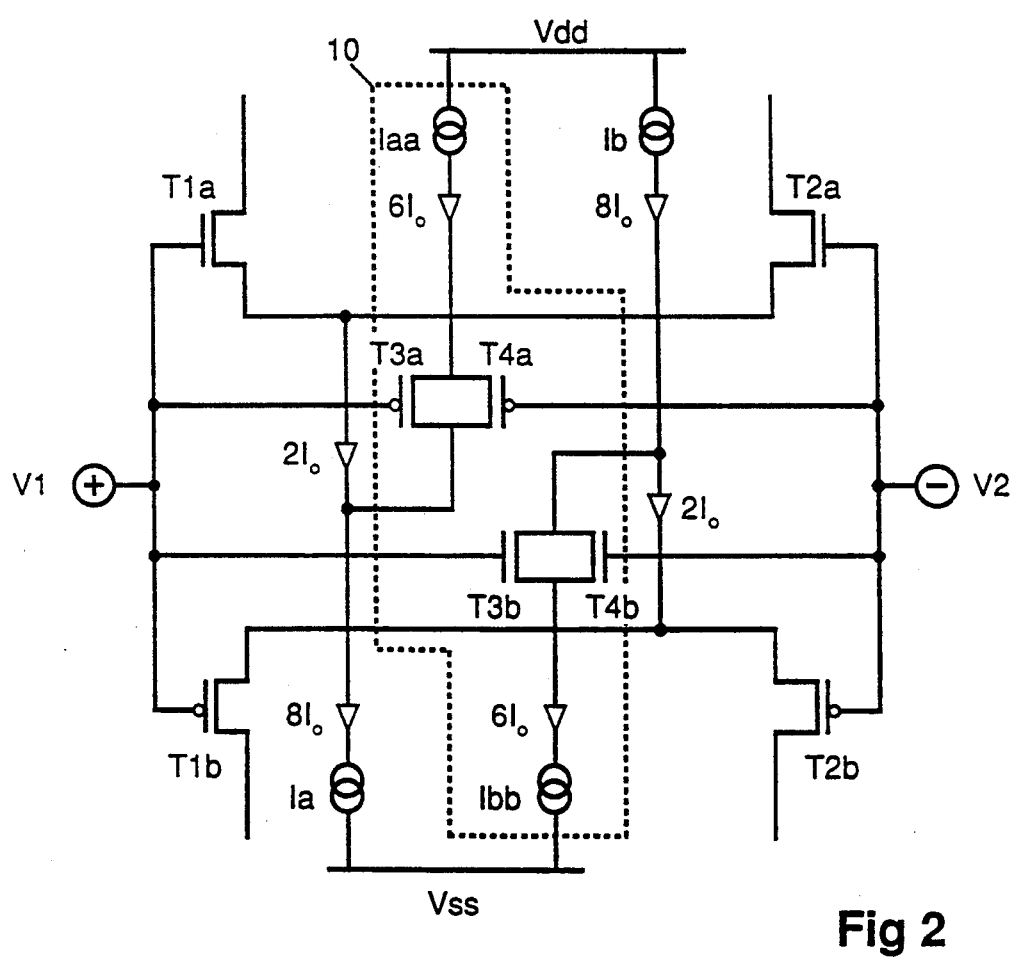
FIG. 2 shows an embodiment of the invention.

In FIG. 2 are shown the differential amplifiers of FIG. 1, namely, transistors T1a, T2a, T1b, T2b and the current sources Ia and Ib.

The additional elements of the circuit according to the invention are represented inside an area limited by dashed lines 10. They enable, in the exceptional operating range where one of the input differential amplifiers is inactive, to double the transconductance of the transistors of the other differential amplifier, whereby the overall transconductance of the OTA remains equal in its three operating ranges.

Two transistors T3a and T4a of the same characteristics as transistors T1b and T2b, are arranged in parallel between a current source Iaa connected to the supply rail Vdd and the sources of transistors T1a and T2a. The gates of transistors T3a and T4a are respectively connected to inputs (+) and (−). Two transistors T3b and T4b of the same characteristics as transistors T1a and T2a, are arranged in parallel between a current source Ibb connected to the supply rail Vss and the sources of transistors T1b and T2b. The gates of transistors T3b and T4b are connected to inputs (+) and (−), respectively. Here, the current sources Ia and Ib each supplies a current $8I_0$ instead of $2I_0$. The current sources Iaa and Ibb each provides a current $6I_0$.

The operating of the circuit according to the invention will be described in connection with its association to the amplifier of FIG. 1.

In the normal operating range, when the two differential amplifiers are active, the transistor pair T3a, T4a and the transistor pair T3b, T4b are conductive. Hence, the current $6I_0$ of each current source Iaa and Ibb is subtracted from current $8I_0$ of each current source Ia and Ib. As a result, a quiescent current $2I_0$ is provided for each differential amplifier and the OTA operates in the normal conditions of the OTA of FIG. 1, i.e. with a transconductance equal to $2g_m(I_0)$ and a maximum output current of $4I_0$.

In the exceptional operating range when voltages V1 and V2 go too close to voltage Vdd, transistors T1b and T2b are blocked as well as transistors T3a and T4a which are controlled in the same way. Thus, current $6I_0$ that flowed through transistors T3a and T4a is no longer derived from the current source Ia and the entire current $8I_0$ of the latter is provided to the sources of transistors T1a and T2a while fixing the quiescent current of each transistor to $4I_0$. Therefore, the quiescent current of transistors T1a and T2a goes from $I_0$ to $4I_0$ and their transconductance, which varies with the quiescent current, goes from $g_m(I_0)$ to $g_m(4I_0)$. The output current, calculated in the same way as for FIG. 1, is therefore:

$$(V1-V2)g_m(4I_0).$$

Since the transconductance $g_m$ of a MOS transistor is proportional to the square root of its quiescent current, one has:

$$g_m(4I_0)=2g_m(I_0).$$

Thus, in this operating range, the output current is equal to $2(V1-V2)g_m(I_0)$, as in the normal operating range. The maximum value of the output current is here $8I_0$.

In the exceptional operating range where voltages V1 and V2 go too close to voltage Vss, the operation of the circuit is symmetrical, namely, since transistors T1a, T2a, T3b, T4b are blocked, the current $6I_0$ that flowed through transistors T3b and T4b is no longer derived from the source Ib and the entire current $8I_0$ of the latter is provided to the sources of transistors T1b and T2b, the quiescent current of which is established at $4I_0$ instead of $I_0$. Similarly, at the output, a current $2(V1-V2)g_m(I_0)$ and a maximum value of the latter of $8I_0$ are obtained.

Thus, an OTA provided with the circuit according to the invention has a constant transconductance over a common mode liable to reach the supply voltages Vdd and Vss.

The maximum output current of this amplifier and therefore its slew-rate, is doubled in the exceptional operating ranges.

Figure 3:
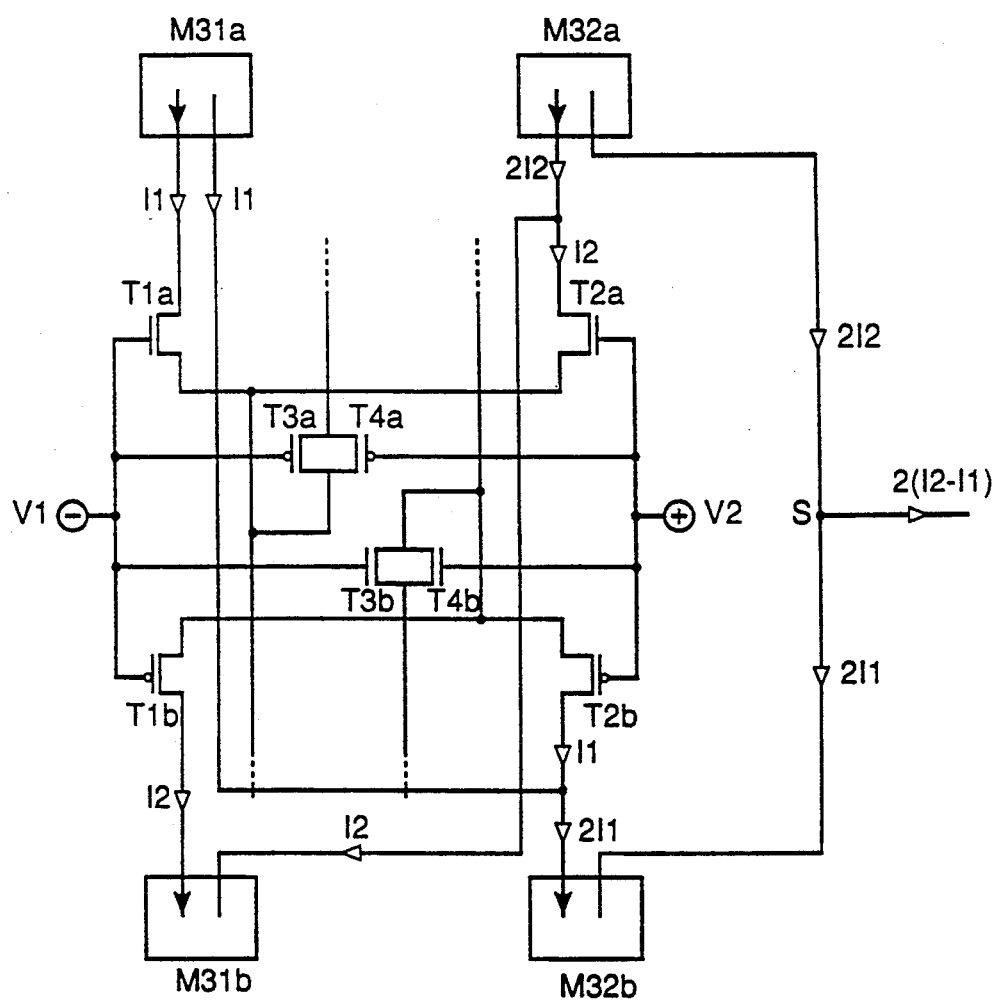
FIG. 3 shows an OTA using the embodiment of FIG. 2.

FIG. 3 schematically illustrates an embodiment of an OTA provided with the circuit according to the invention and which has the advantage of comprising one current mirror less than the circuit of FIG. 1.

In FIG. 3 are shown all the elements of FIG. 2 but inputs (+) and (−) are interchanged. The drains of transistors T1a and T2a are respectively connected to the inputs of the current mirrors M31a and M32a. The drains of transistors T1b and T2b are respectively connected to the inputs of the current mirrors M31b and M32b. The outputs of mirrors M32a and M32b are interconnected and constitute the output S of the OTA. The output of mirror M31a is connected to the drain of transistor T2b and the output of mirror M31b is connected to the drain of transistor T2a.

When a voltage V1 is applied to the input (−) and a voltage V2 to the input (+), a current I1 flows in the drains of each transistor T1a and T2b and a current I2 flows in the drains of each transistor T2a and T1b. The drain current I1 of transistor T1a is copied to the output of mirror M31a and is added to the drain current I1 of transistor T2b. Thus, mirror M32b receives at its input a current 2I1 that its output draws from the output S of the OTA. The drain current I2 of transistor T1b is copied to the output of mirror M31b and is added to the drain current I2 of transistor T2a. Thus, mirror M32a receives at its input a current 2I2 which is provided at the output of the amplifier. The output current of the amplifier is:

$$2(I2-I1)=2(V2-V1)g_m(I_0).$$

When one of the differential amplifiers is inactive, for example the one comprising transistors T1a and T2a, mirror M32a receives at its input only the output current of mirror M31b and mirror M32b receives at its input only the drain current of transistor T2b. But the value of these currents is double because the circuit according to the invention doubles the transconductance of transistors T1b and T2b, as described for FIG. 2, and the output current remains unchanged with respect to the previous normal operating.

When the differential amplifier comprising transistors T1b and T2b is inactive, the operating is symmetrical.

The circuit of the invention applies to all OTAs comprising an input configuration with two complementary differential amplifiers and enables the OTA to operate with a constant transconductance for a common mode variable over the whole range between the two supply voltages.

The invention has been described in order to obtain a constant transconductance of the OTA. As seen above, the maximum output current was twice as high in the exceptional operating ranges, which caused a slew-rate twice as high within these ranges. If a constant slew-rate is desired over the three ranges instead of a constant transconductance, the quiescent currents of the active transistors within the exceptional operating ranges is doubled instead of being multiplied by 4.

The invention has been described in relation with MOS transistors, but it can be used without modification in bipolar technology, except that the quiescent currents of the active transistors within the exceptional operating ranges are doubled instead of being multiplied by 4. In this case, unlike in an embodiment with MOS transistors, the transconductance of the OTA as well as its slew-rate are constant over the three operating ranges.

In order to double the quiescent currents within the exceptional operating ranges, the currents of the current sources Ia and Ib are fixed to $4I_0$ and those of sources Iaa and Ibb to $2I_0$.

Many alternatives and modifications of the invention will appear to those skilled in the art, especially, any other circuit can be used to detect the non-operation of the differential amplifiers and to derive an adequate current from the current provided by sources Ia and Ib.

I claim:

1. A transconductance amplifier comprising:
   a first differential amplifier with a pair of transistors of a first type, each of which is controlled by one of two inputs, the quiescent current of said transistors being fixed to a predetermined value by a first current source connected to a first supply rail;
   a second differential amplifier with a pair of transistors of a type opposite to that of the first, each of which is controlled by one of said inputs, the quiescent current of these transistors being fixed to said predetermined value by a second current source connected to a second supply rail; the transconductance amplifier having a first operating range where the two differential amplifiers are active and second and third operating ranges where only one differential amplifier is active;
   means for deriving constant current equal to a predetermined fraction of the currents provided by the current sources to the differential amplifiers, said means being active in the first operating range and inactive in one of the second and third ranges, and the predetermined fraction being such that the transconductance of the active transistors in one of the second and third ranges is equal to twice the transconductance of the transistors in the first range.

2. A transconductance amplifier according to claim 1, wherein said means comprise:
   a third pair of transistors of the opposite type, each of which is controlled by one of said inputs, said transistors being arranged in parallel between the first current source and a third current source connected to the second supply rail; and
   a fourth pair of transistors of the first type, each of which is controlled by one of said inputs, said transistors being arranged in parallel between the second current source and a fourth current source connected to the first supply rail;
   the current provided by each of said third and fourth current sources being equal to said predetermined fraction.

3. A transconductance amplifier according to claim 2, comprising:
   a first current mirror, the input of which loads one of the transistors of the first differential amplifier;
   a second current mirror, the input of which loads the other transistor of the first differential amplifier;
   a third current mirror, the input of which loads one of the transistors of the second differential amplifier; and
   a fourth current mirror, the input of which loads the other transistor of the second differential amplifier;
   the output of said first mirror being connected to the input of the fourth mirror, the output of the third mirror being connected to the input of the second mirror, and the outputs of the second and fourth mirrors being interconnected and constituting the output of the amplifier.

4. A transconductance amplifier according to claim 1, wherein said differential amplifiers comprise field effect type transistors.

5. A transconductance amplifier according to claim 4, wherein said predetermined fraction is equal to 75%.

6. A transconductance amplifier according to claim 4, wherein said predetermined fraction is equal to 50%.

7. A transconductance amplifier according to claim 1, wherein said differential amplifiers comprise bipolar type transistors.

8. An operational amplifier having inputs and supplied by first and second supply voltages comprising:
a first pair of transistor connected between the inputs and coupled to a source of the first supply voltage through a first reference current source supplying reference current,
a second pair of transistors connected between the inputs and coupled to a source of the second supply voltage through a second reference current source supplying the reference current,
said amplifier operating in an operating range between the first and second supply voltages consisting of a middle range between a first predetermined voltage and a second predetermined voltage, a first end range between the first supply voltage and the first predetermined voltage, and a second end range between the second supply voltage and the second predetermined voltage, said first predetermined voltage being equal to a voltage turning off the transistors of the first pair, said second predetermined voltage being equal to a voltage turning off the transistors of the second pair,
a first controlled current generator coupled to the first reference current source and controlled through the inputs of the operational amplifier for supplying a first constant current equal to a predetermined fraction of the reference current in the middle range, said first constant current being subtracted from the reference current, said first controlled current generator being blocked in the second end range, and
a second controlled current generator coupled to the second reference current source and controlled through the inputs of the operational amplifier for supplying a second constant current equal to the predetermined fraction of the reference current in the middle range, said second constant current being subtracted from the reference current, said second controlled current generator being blocked in the first end range.

9. The amplifier according to claim 8, wherein said first controlled current generator comprises a third pair of transistors connected between the inputs of the operational amplifier and coupled to a source of the first constant current.

10. The amplifier according to claim 9, wherein said source of the first constant current is coupled to the source of the second supply voltage.

11. The amplifier according to claim 8, wherein said second controlled current generator comprises a fourth pair of transistors connected between the inputs of the operational amplifier and coupled to a source of the second constant current.

12. The amplifier according to claim 11, wherein said source of the second constant current is coupled to the source of the first supply voltage.

13. An amplifier having inputs and supplied by first and second supply voltages comprising:
reference current means for supplying a reference current to the amplifier,
first transistor means connected between the inputs and coupled to a source of the first supply voltage through said reference current means,
second transistor means connected between the inputs and coupled to a source of the second supply voltage through said reference current means,
said amplifier operating in an operating range between the first and second supply voltages consisting of a middle range between a first predetermined voltage and a second predetermined voltage, a first end range between the first supply voltage and the first predetermined voltage, and a second end range between the second supply voltage and the second predetermined voltage, said first predetermined voltage being equal to a voltage turning off the first transistor means, said second predetermined voltage being equal to a voltage turning off the second transistor means,
first controlled current generating means responsive to the inputs of the amplifier for supplying a first constant current equal to a predetermined fraction of the reference current in the middle range, said first constant current being subtracted from the reference current, said first controlled current generating means being blocked in the second end range, and
second controlled current generating means responsive to the inputs of the amplifier for supplying a second constant current equal to the predetermined fraction of the reference current in the middle range, said second constant current being subtracted from the reference current, said second controlled current generating means being blocked in the first end range.

14. The amplifier according to claim 13, wherein said first controlled current generating means comprises third transistor means connected between the inputs of the amplifier and coupled to a source of the first constant current.

15. The amplifier according to claim 14, wherein said source of the first constant current is coupled to the source of the second supply voltage.

16. The amplifier according to claim 13, wherein said second controlled current generating means comprises fourth transistor means connected between the inputs of the operational amplifier and coupled to a source of the second constant current.

17. The amplifier according to claim 16, wherein said source of the second constant current is coupled to the source of the first supply voltage.

18. The amplifier according to claim 13, wherein said first and second transistor means comprise bipolar transistors and said first and second controlled current generating means supply constant current equal to 50% of the reference current.

19. The amplifier according to claim 13, wherein said first and second transistor means comprise field effect type transistors and said first and second controlled current generating means supply constant current equal to 75% of the reference current.

20. A transconductance amplifier comprising:
a first differential amplifier with a pair of transistors of a first type, each of which is controlled by one of two inputs, the quiescent current of said transistors being fixed to a predetermined value by a first current source connected to a first supply rail;

a second differential amplifier with a pair of transistors of a type opposite to that of the first, each of which is controlled by one of said inputs, the quiescent current of these transistors being fixed to said predetermined value by a second current source connected to a second supply rail; the transconductance amplifier having a first operating range where the two differential amplifiers are active and second and third operating ranges where only one differential amplifier is active;

means for deriving a predetermined fraction of the currents provided by the current sources to the differential amplifiers, said means being active in the first operating range and inactive in one of the second or third ranges, and the predetermined fraction being such that the transconductance of the active transistors in one of the second or third ranges is equal to twice the transconductance of the transistors in the first range;

wherein said means comprise:

a third pair of transistors of the opposite type, each of which is controlled by one of said inputs, said transistors are arranged in parallel between the first current source and a third current source connected to the second supply rail; and a fourth pair of transistors of the first type, each of which is controlled by one of said inputs, said transistors are arranged in parallel between the second current source and a fourth current source connected to the first supply rail;

the current provided by each of said third and fourth current sources is equal to said predetermined fraction.

21. A transconductance amplifier according to claim 20, further comprising:

a first current mirror, the input of which loads one of the transistors of the first differential amplifier;

a second current mirror, the input of which loads the other transistor of the first differential amplifier;

a third current mirror, the input of which loads one of the transistors of the second differential amplifier; and a fourth current mirror, the input of which loads the other transistor of the second differential amplifier;

the output of said first mirror being connected to the input of the fourth mirror, the output of the third mirror being connected to the input of the second mirror, and the outputs of the second and fourth mirrors being interconnected and constituting the output of the amplifier.

* * * * *